United States Patent [19]

Pegg et al.

[11] Patent Number: 5,463,310
[45] Date of Patent: Oct. 31, 1995

[54] INSTRUMENT FOR MEASURING THE FREQUENCY AND POWER OF A MICROWAVE SIGNAL

[75] Inventors: Timothy J. Pegg, Gamlingay; George Hjipieris, Hitchin; Andrew G. Bullock, Hemel Hempstead, all of England

[73] Assignee: Marconi Instruments Limited, United Kingdom

[21] Appl. No.: 333,359

[22] Filed: Nov. 2, 1994

Related U.S. Application Data

[63] Continuation of Ser. No. 966,728, Oct. 26, 1992, abandoned.

[30] Foreign Application Priority Data

Nov. 25, 1991 [GB] United Kingdom .................. 9124973

[51] Int. Cl.[6] .................................................. G01R 23/02
[52] U.S. Cl. ............................................................. 324/95
[58] Field of Search ................................ 324/95, 76.55, 324/76.56, 632, 642, 639, 636, 641, 640; 333/243, 246, 248

[56] References Cited

U.S. PATENT DOCUMENTS

| | | | |
|---|---|---|---|
| 3,125,722 | 3/1964 | Lenehan | 324/142 |
| 4,135,152 | 1/1979 | Stuchly et al. | 324/95 |
| 4,206,403 | 6/1980 | Tucker | 324/95 |
| 4,238,732 | 12/1980 | Aston | 324/158 D |
| 4,727,311 | 2/1988 | Walker | 324/76.56 |
| 4,873,484 | 10/1989 | Adam | 324/95 |
| 4,996,490 | 2/1991 | Scott et al. | 324/639 |
| 5,083,088 | 1/1992 | Bereshin | 324/632 |

OTHER PUBLICATIONS

Book entitled: "Radio frequency and microwave power measurement", by A. Fantom, Published by Peter Peregrinus Ltd. on behalf of Institution of Electrical Engineers, pp. 91–110.
Book entitled: "Microwave measurements", edited by A. E. Bailey, pubished by Peter Peregrinus Ltd. on behalf on Institution of Electrical Engineers, pp. 334–336.
Soviet Inventions Illustrated, Section El., Mar. 23, 1988, Derwent Publications, Ltd.
Soviet Inventions Illustrated, Section R, Feb. 28, 1978, Derwent Publications Ltd.
Soviet Inventions Illustrated, Section El., Nov. 21, 1986, Derwent Publications Ltd.

Primary Examiner—Vinh P. Nguyen
Attorney, Agent, or Firm—Kirschstein, et al.

[57] ABSTRACT

An instrument which provides a measurement of the frequency and power of a microwave signal supplied to an input port of the instrument. The instrument includes: a resistive device which divides the microwave signal supplied into first and second microwave divisions thereof; a frequency counter which measures the frequency of the first microwave division, thereby providing the measurement of the frequency of the microwave signal supplied; and a power sensor and power meter combination which measures the power of the second microwave division. The power sensor and meter combination makes a calibration correction dependent on the frequency measured by the frequency counter to its power measurement, thereby providing the measurement of the power of the microwave signal supplied.

12 Claims, 1 Drawing Sheet

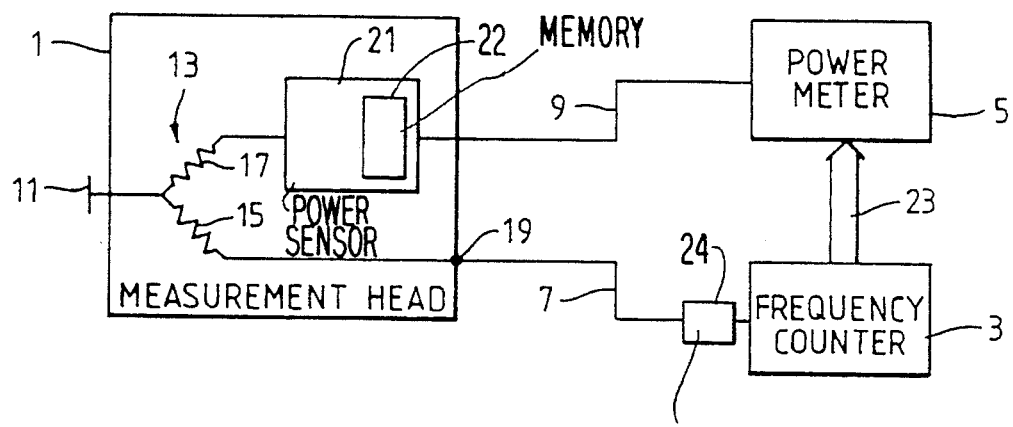
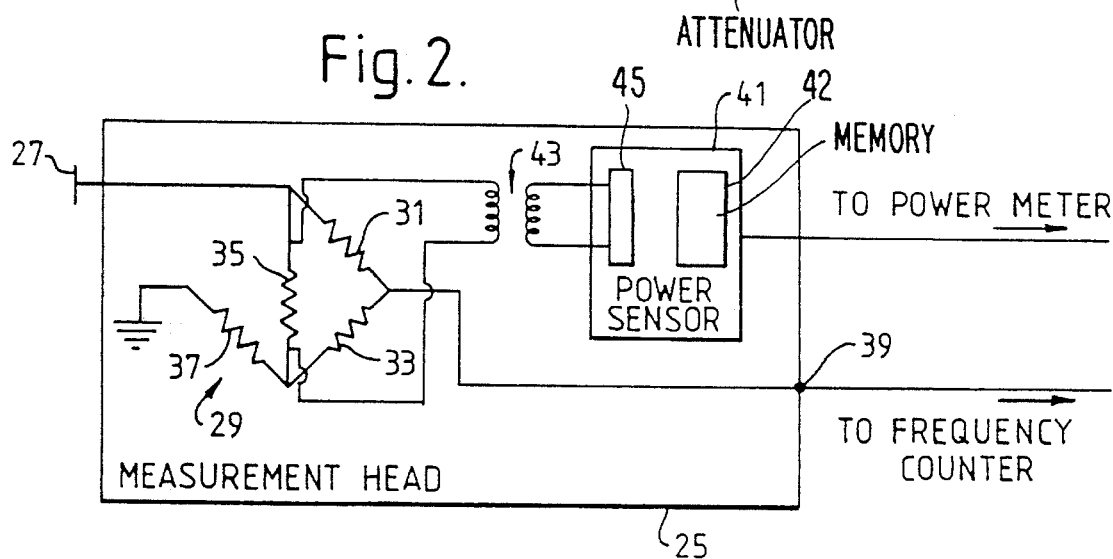
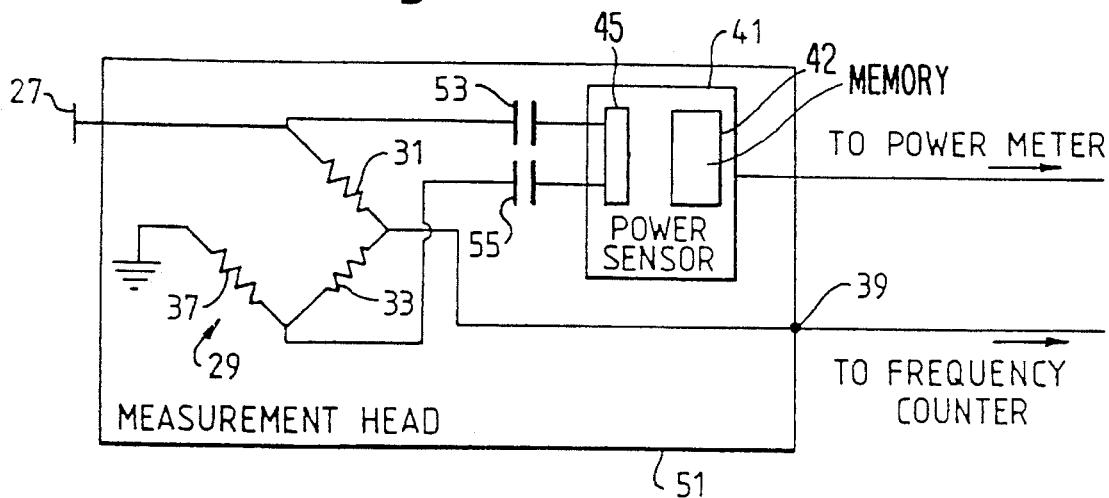

INSTRUMENT FOR MEASURING THE FREQUENCY AND POWER OF A MICROWAVE SIGNAL

This application is a continuation of Ser. No. 07/966,728 filed on Oct. 26, 1992, now abandoned.

BACKGROUND OF THE INVENTION

1. Field of the Invention

This invention relates to instruments for measuring the frequency and power of a microwave signal.

2. Description of the Related Art

One known such instrument comprises an input port for receiving the microwave signal, means for down-converting the microwave signal to an intermediate frequency signal, and means for measuring the frequency and power of the intermediate frequency signal thence to provide, after taking into account the down-conversion, a measure of the frequency and power of the microwave signal.

A problem with this known instrument is that the frequency and power measurements are performed on an intermediate frequency signal derived from the microwave signal, and not the microwave signal itself. This leads to inaccuracy in the measurement of the power of the microwave signal. The down-conversion is made in the known instrument in order to avoid the difficulties associated with making simultaneous frequency and power measurements on a microwave frequency signal.

SUMMARY OF THE INVENTION

It is an object of the present invention to provide an instrument for measuring the frequency and power of a microwave signal wherein the above problem is overcome.

According to the present invention there is provided an instrument for measuring the frequency and power of a microwave signal comprising: an input port for receiving said microwave signal, means for dividing said microwave signal into first and second microwave divisions thereof; means for measuring the frequency of said first microwave division; and means for measuring the power of said second microwave division.

BRIEF DESCRIPTION OF THE DRAWINGS

An instrument in accordance with the present invention will now be described, by way of example, with reference to the accompanying drawings, in which:

FIG. 1 is a schematic circuit diagram of the instrument;

FIG. 2 shows an improved measurement head to the measurement head of the instrument of FIG. 1; and FIG. 3 shows an alternative measurement head to the head of FIG. 2.

DETAILED DESCRIPTION OF THE PREFERRED EMBODIMENTS

Referring to FIG. 1, the instrument comprises a measurement head 1, a frequency counter 3, and a power meter 5. The measurement head 1 is for connection to the source of the microwave signal to be measured, and is remotely connected to the frequency counter 3 and power meter 5 by means of flexible connections 7, 9 respectively, flexible connection 7 of which is a microwave cable.

The head 1 comprises an input port 11 for receiving the microwave signal, a microwave signal splitter 13 comprising first and second 50 ohm resistors 15, 17 for dividing the received microwave signal into first and second microwave divisions thereof, in this division the power of the received microwave signal being divided and each of the first and second microwave divisions having the same microwave frequency as the received microwave signal, an output port 19 for receiving the first microwave division and passing it to the microwave cable 7 for frequency measurement by the frequency counter 3, and a power sensor 21 for sensing the power of the second microwave division and providing an output indicative thereof to the power meter 5 by means of flexible connection 9.

The power sensor 21 includes a memory 22 which stores in respect of each of a series of frequencies a calibration correction factor previously derived during calibration of the instrument. The calibration is necessary at a series of frequencies to compensate for variation in the sensitivity of the power sensor 21 with frequency. The frequency measured by the frequency counter 3 is supplied, by means of a connection 23 between the counter 3 and power meter 5, to the meter 5 which reads the memory 22 of the power sensor 21 for the calibration correction factor corresponding to the measured frequency. This factor is applied by the power meter 5.

A drawback of the instrument of FIG. 1 is the poor input match of the frequency counter 3 which gives rise to reflection of the first microwave division which reaches the power sensor 21. To cater for this reflection it is necessary that the memory 22 of the sensor 21 store a calibration correction factor in respect of each of a very large number of frequencies. The input match of the counter 3 can be improved by incorporating at the input to the counter 3 an attenuator 24. However, this results in a reduction in the sensitivity of the frequency measurement. The improved measurement head of FIG. 2 overcomes these problems.

Referring to FIG. 2, the improved measurement head 25 comprises an input port 27 for receiving the microwave signal to be measured, a directional bridge 29 comprising first, second, third, and fourth 50 ohm resistors 31, 33, 35, 37 for dividing the received microwave signal into first and second microwave divisions thereof, in this division the power of the received microwave signal being divided and each of the first and second microwave divisions having the same microwave frequency as the received microwave signal, an output port 39 for receiving the first microwave division and passing it to microwave cable 7 (FIG. 1), and a power sensor 41 for sensing the power of the second microwave division and providing an output indicative thereof on connection 9 (FIG. 1). The second microwave division is derived across resistor 35 and applied by way of a balun 43 across a power sensing element 45 (e.g. diode or thermoelectric device) of the power sensor 41. The balun 43 decouples the ground of sensor 41 from the ground of bridge 29.

The sensor 41 includes a memory 42, as the memory 22 of sensor 21 of FIG. 1, which stores in respect of each of a series of frequencies a calibration correction factor.

Thus, given that the resistance of the source of the microwave signal to be measured is 50 ohms, the second microwave division for power measurement is derived across the central resistor 35 of a bridge 29 balanced as regards reflection from the frequency counter 3 (FIG. 1), that is set up such that reflection from the counter 3 does not contribute to any current flowing through and potential difference across resistor 35. Therefore, reflection from counter 3 does not reach power sensor 41. It will be noted that for the bridge 29 to be balanced the resistances of the resistors 31, 33, 37 and the microwave source need not all be 50 ohms, it only being necessary that they obey the relationship:

$$\frac{R_{31}}{R_{33}} = \frac{R_S}{R_{37}},$$

where $R_{31}$, $R_{33}$, $R_{37}$ and $R_S$ are the resistances of the resistors 31, 33, 37 and the microwave source respectively.

Referring to FIG. 3, components of the alternative measurement head 51 that are the same as those of the head 25 of FIG. 2 are labelled with the same reference numerals. The head 51 of FIG. 3 is the same as the head 25 of FIG. 2 except that the ground of sensor 41 is decoupled from the ground of bridge 29 by means of capacitors 53, 55 not balun 43, and resistor 35 of bridge 29 is omitted.

In effect, the bridge 29 of FIGS. 2 and 3 provides much greater isolation (ideally perfect isolation) between the counter 3 and sensor 41 than the very little isolation provided by the splitter 13 of FIG. 1 between the counter 3 and sensor 21. It is to be noted that, a directional bridge is particularly suitable for use when measuring broadband microwave signals, e.g. 10 MHz–26.5 GHz.

We claim:

1. An instrument which provides a measurement of the frequency and power of a microwave signal supplied to an input port of said instrument, comprising: resistive means for dividing said microwave signal into first and second microwave divisions thereof; frequency measuring means for measuring the frequency of said first microwave division, thereby providing said measurement of the frequency of said microwave signal supplied to said input port; and power measuring means for measuring the power of said second microwave division, said power measuring means including a memory for storing a calibration correction factor for a plurality of frequencies, said power measuring means making an initial incorrect measurement of the power and then making a frequency dependent calibration correction to this initial measurement by applying to the initial measurement the calibration correction factor previously determined for the particular frequency measured by said frequency measuring means, said application of the calibration correction factor providing said measurement of the power of said microwave signal supplied to said input port; and, in said instrument, said power measuring means being isolated from said frequency measuring means to inhibit reflections of said first microwave division by said frequency measuring means reaching said power measuring means.

2. An instrument according to claim 1 wherein: said means for measuring the frequency comprises a frequency counter; and said means for measuring the power comprises a power sensor and a power meter connected to the output of the power sensor.

3. An instrument according to claim 2 wherein: said input port, said resistive means for dividing, and said power sensor are located in a measurement head of the instrument remote from said power meter and said frequency counter; said frequency counter is connected to said measurement head by means of a microwave cable of the instrument; said frequency counter and said power meter are connected together so that the frequency counter supplies of its frequency measurement to the power meter; said power sensor includes the memory which stores in respect of each of a series of frequencies a said calibration correction factor for the making of said calibration correction; and said power meter reads said memory for the calibration correction factor corresponding to the frequency supplied to the power meter by said frequency counter and makes therewith said calibration correction.

4. An instrument according to claim 1 wherein; said resistive means for dividing comprises a microwave signal splitter comprising first and second resistors, one side of each of which resistors is connected to a junction which is connected to said input port, the other sides of said first and second resistors being connected respectively to said means for measuring the frequency and said means for measuring the power; and said isolation between said power and said frequency measuring means is provided by attenuator means connected at the input said frequency measuring means.

5. An instrument according to claim 4 wherein said first and second resistors are each 50 ohm resistors.

6. An instrument according to claim 1 wherein said resistive means for dividing comprises a directional device which provides said isolation between said power and said frequency measuring means.

7. An instrument according to claim 6 wherein said directional device comprises a directional bridge comprising first, second, third and fourth resistors, one side of each of the first and second resistors and said means for measuring the frequency being connected to a first junction, the other side of said first resistor and one side of said third resistor and said input port being connected to a second junction, the other sides of said second and third resistors and one side of said fourth resistor being connected to a third junction, the other side of said fourth resistor being grounded, a power sensing element of said means for measuring the power being connected across said third resistor, the values of said first, second and fourth resistors obeying the relationship:

$$\frac{R_1}{R_2} = \frac{R_S}{R_4},$$

where $R_1$, $R_2$ and $R_4$ are the resistances of the first, second and fourth resistors respectively and $R_S$ is the resistance of the source of the microwave signal to be measured.

8. An instrument according to claim 7 wherein the resistance of each of said first, second, third and fourth resistors is 50 ohms.

9. An instrument according to claim 7 wherein said power sensing element is connected across said third resistor by way of a balun.

10. An instrument according to claim 6 wherein said directional device comprises a directional bridge comprising first, second and third resistors, one side of each of the first and second resistors and said means for measuring the frequency being connected to a first junction, the other side of said first resistor and said input port being connected to a second junction, the other side of said second resistor and one side of said third resistor being connected to a third junction, the other side of said third resistor being grounded, a power sensing element of said means for measuring the power being connected across said second and third junctions, the values of said first, second and third resistors obeying the relationship:

$$\frac{R_1}{R_2} = \frac{R_S}{R_3},$$

where $R_1$, $R_2$ and $R_3$ are the resistances of the first, second and third resistors respectively and $R_S$ is the resistance of the source of the microwave signal to be measured.

11. An instrument according to claim 10 wherein the resistance of each of said first, second and third resistors is 50 ohms.

12. An instrument according to claim 10 wherein said power sensing element is connected across said second and third junctions by way of first and second capacitors, the first being connected between one side of said power sensing element and said second junction, the second being connected between the other side of said power sensing element and said third junction.

* * * * *